(12) United States Patent
Bobde et al.

(10) Patent No.: US 8,835,977 B2
(45) Date of Patent: Sep. 16, 2014

(54) TVS WITH LOW CAPACITANCE AND FORWARD VOLTAGE DROP WITH DEPLETED SCR AS STEERING DIODE

(71) Applicants: Madhur Bobde, San Jose, CA (US); Lingpeng Guan, Santa Clara, CA (US); Anup Bhalla, Santa Clara, CA (US); Limin Weng, Shanghai (CN)

(72) Inventors: Madhur Bobde, San Jose, CA (US); Lingpeng Guan, Santa Clara, CA (US); Anup Bhalla, Santa Clara, CA (US); Limin Weng, Shanghai (CN)

(73) Assignee: Alpha and Omega Semiconductor Incorporated, Sunnyvale, CA (US)

( * ) Notice: Subject to any disclaimer, the term of this patent is extended or adjusted under 35 U.S.C. 154(b) by 5 days.

(21) Appl. No.: 13/720,140

(22) Filed: Dec. 19, 2012

(65) Prior Publication Data

US 2014/0167101 A1 Jun. 19, 2014

(51) Int. Cl.
*H01L 29/866* (2006.01)
*H01L 27/04* (2006.01)
*H01L 27/02* (2006.01)
*H01L 27/08* (2006.01)

(52) U.S. Cl.
CPC ............ *H01L 27/04* (2013.01); *H01L 27/0259* (2013.01); *H01L 27/0814* (2013.01); *H01L 29/866* (2013.01)

USPC .... 257/112; 257/328; 257/107; 257/E29.335; 438/212; 438/268; 361/56

(58) Field of Classification Search
CPC ............ H01L 27/0259; H01L 27/0814; H01L 29/866; H01L 27/0817; H01L 29/0657
USPC .......... 257/112, 328, E29.335; 438/212, 268; 361/56, 118
See application file for complete search history.

(56) References Cited

U.S. PATENT DOCUMENTS

2007/0279824 A1* 12/2007 Mallikararjunaswamy .. 361/118

* cited by examiner

*Primary Examiner* — Thinh T Nguyen
(74) *Attorney, Agent, or Firm* — Bo-In Lin

(57) ABSTRACT

A transient-voltage suppressing (TVS) device disposed on a semiconductor substrate of a first conductivity type. The TVS includes a buried dopant region of a second conductivity type disposed and encompassed in an epitaxial layer of the first conductivity type wherein the buried dopant region extends laterally and has an extended bottom junction area interfacing with the underlying portion of the epitaxial layer thus constituting a Zener diode for the TVS device. The TVS device further includes a region above the buried dopant region further comprising a top dopant layer of a second conductivity type and a top contact region of a second conductivity type which act in combination with the epitaxial layer and the buried dopant region to form a plurality of interfacing PN junctions constituting a SCR acting as a steering diode to function with the Zener diode for suppressing a transient voltage.

17 Claims, 17 Drawing Sheets

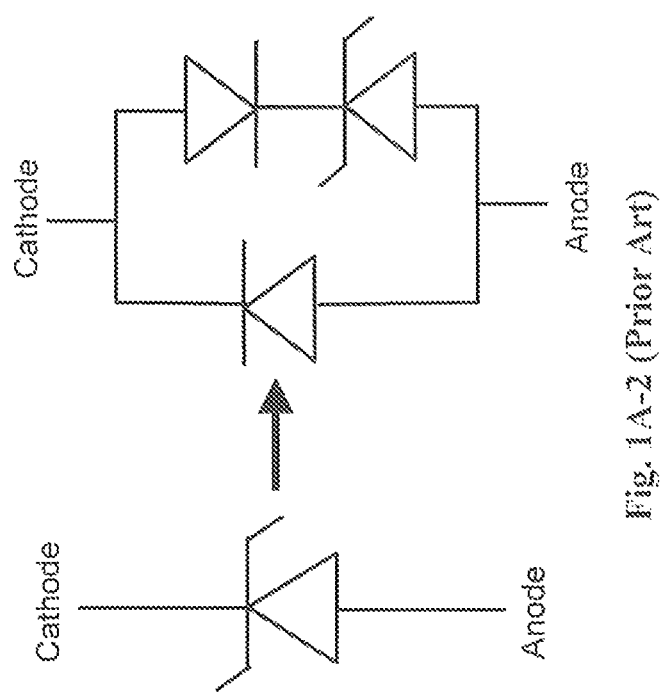

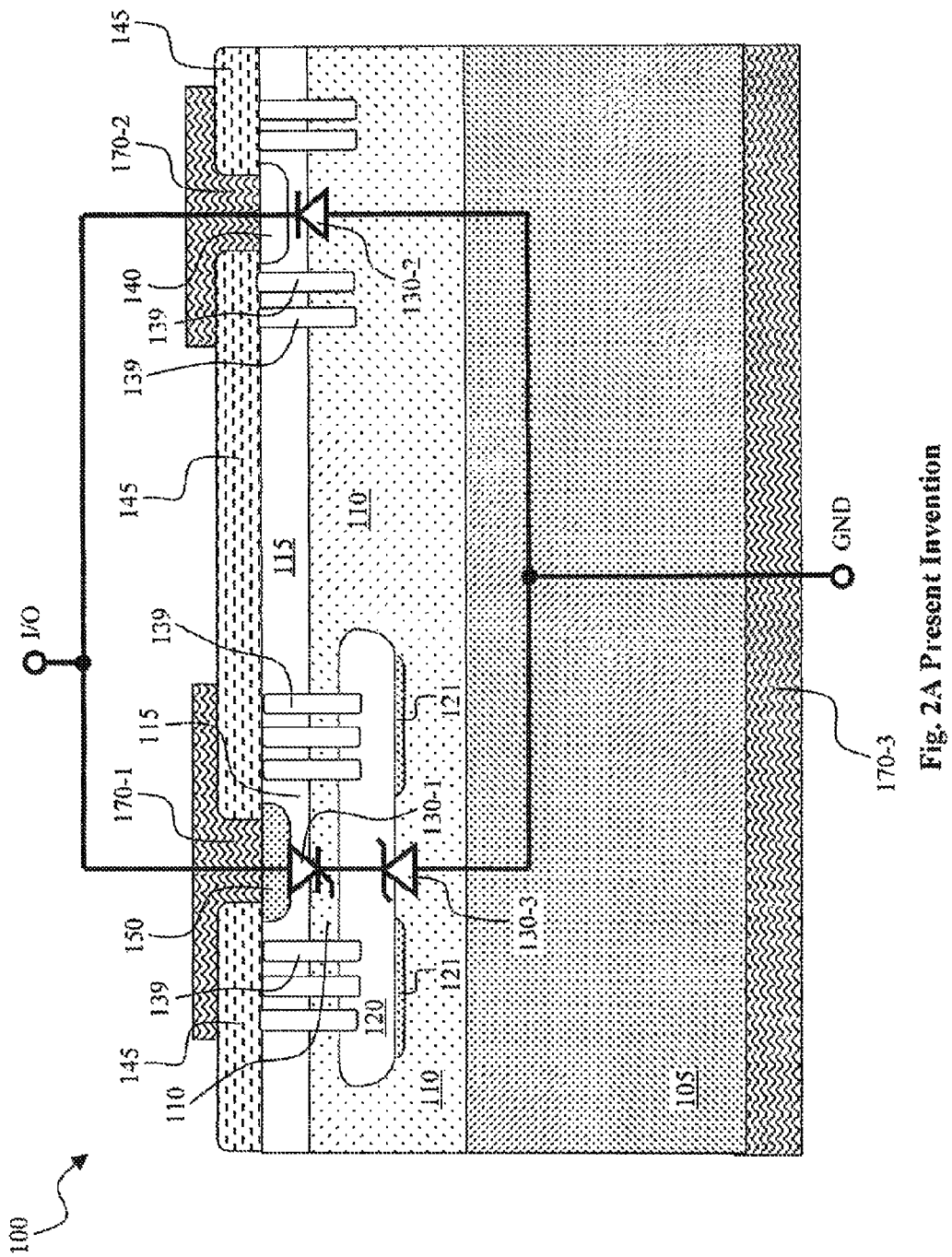
Fig. 2A Present Invention

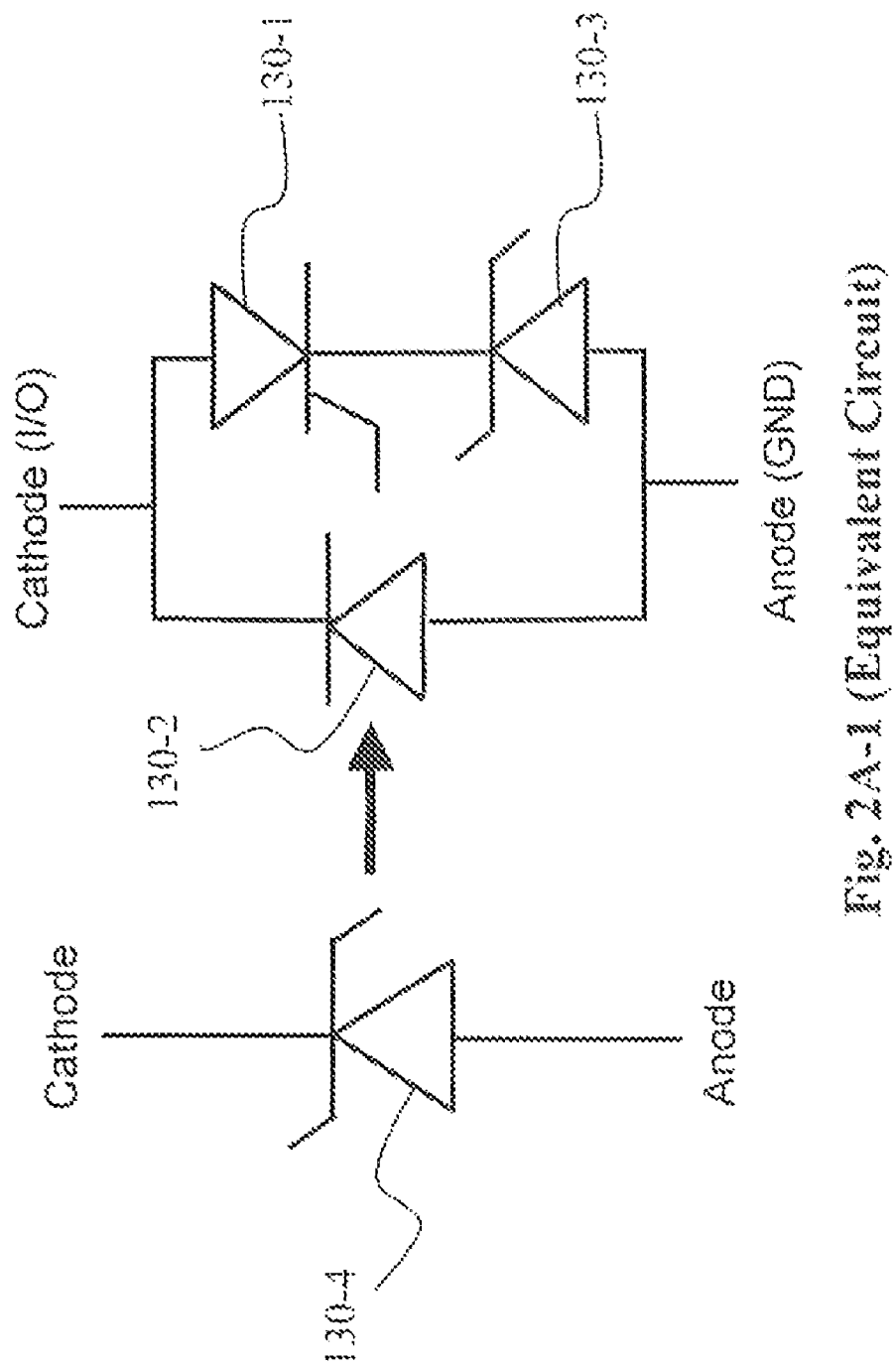
Fig. 2A-1 (Equivalent Circuit)

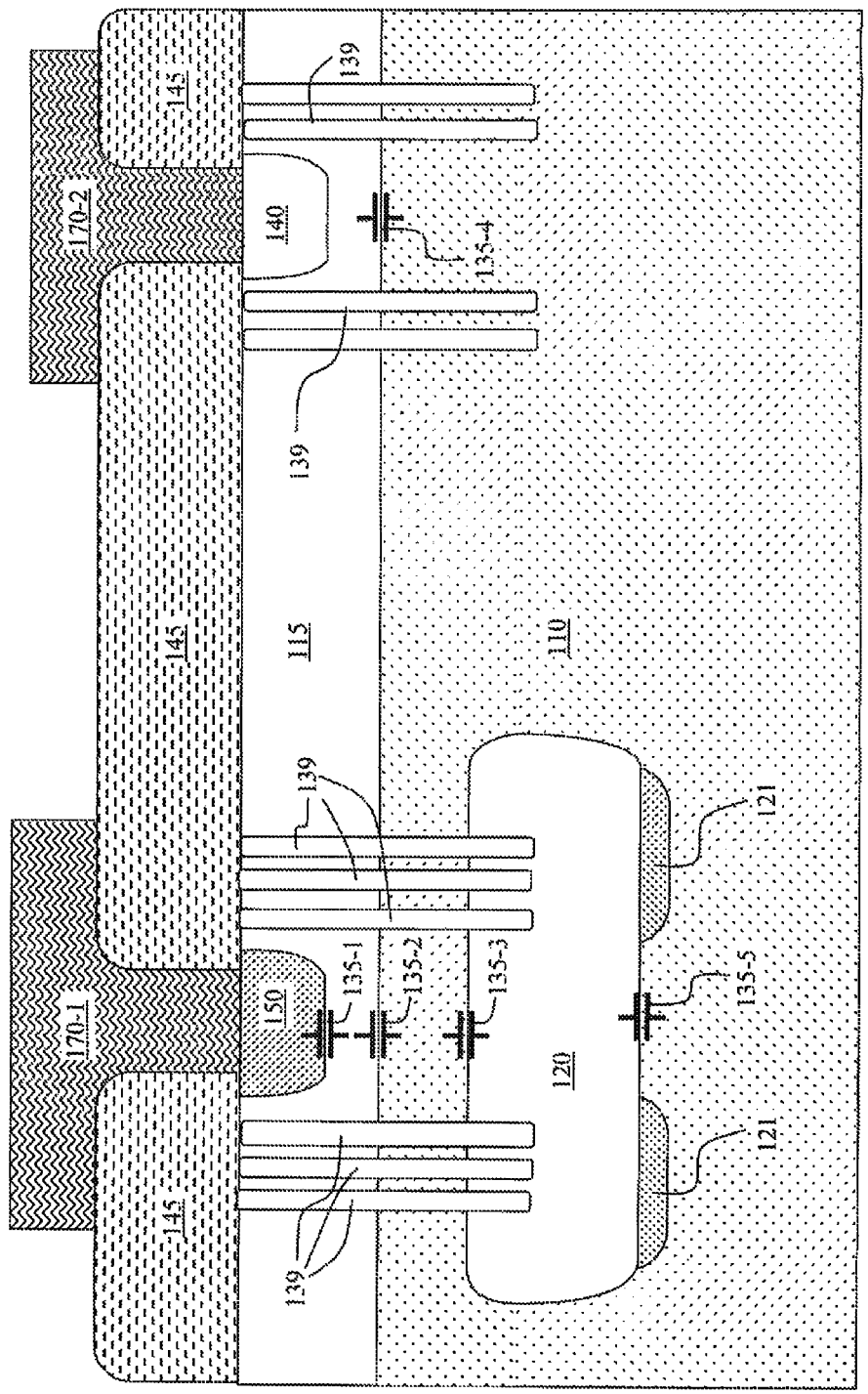
Fig. 2B Present Invention

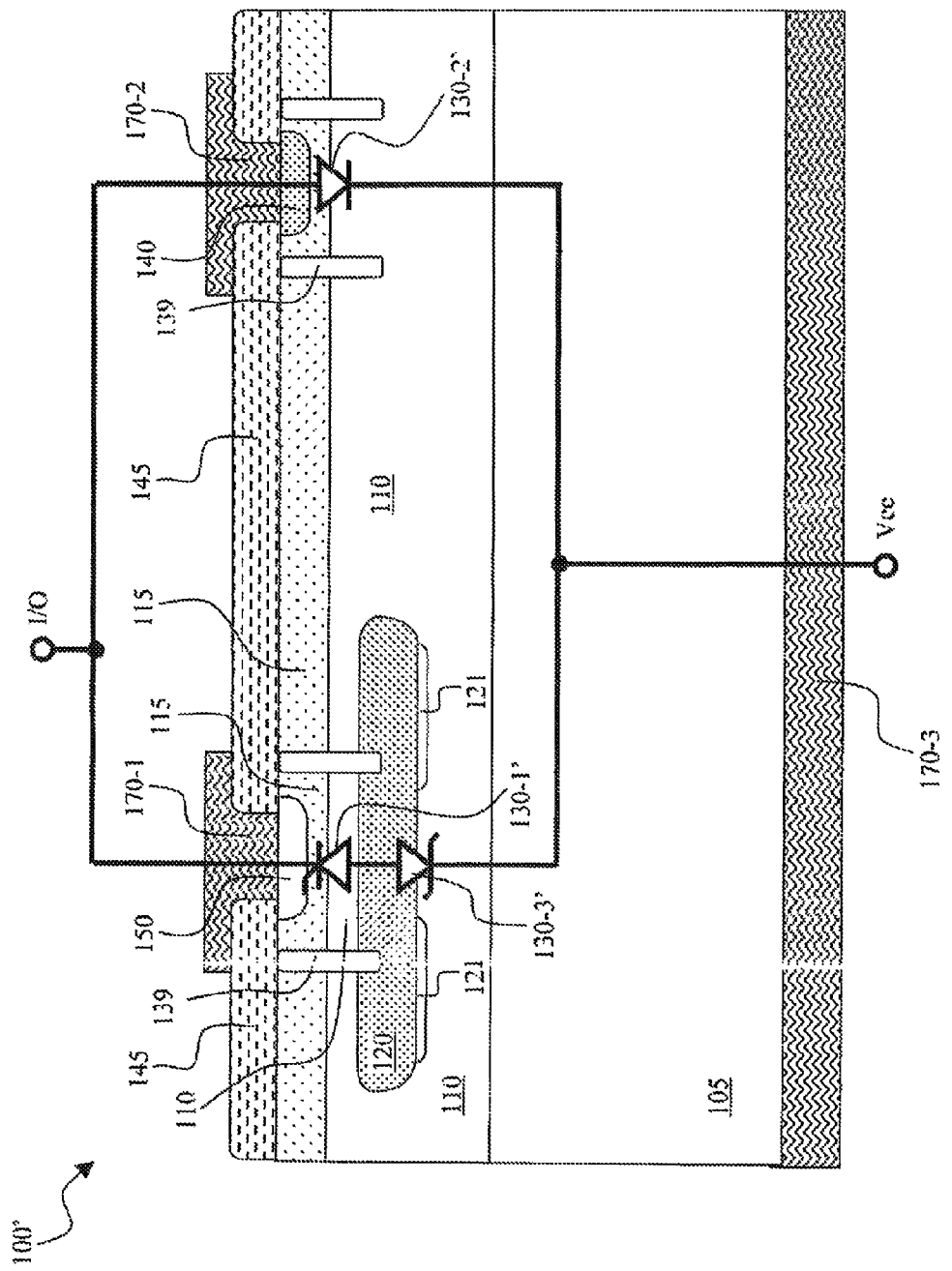
Fig. 2C Present Invention

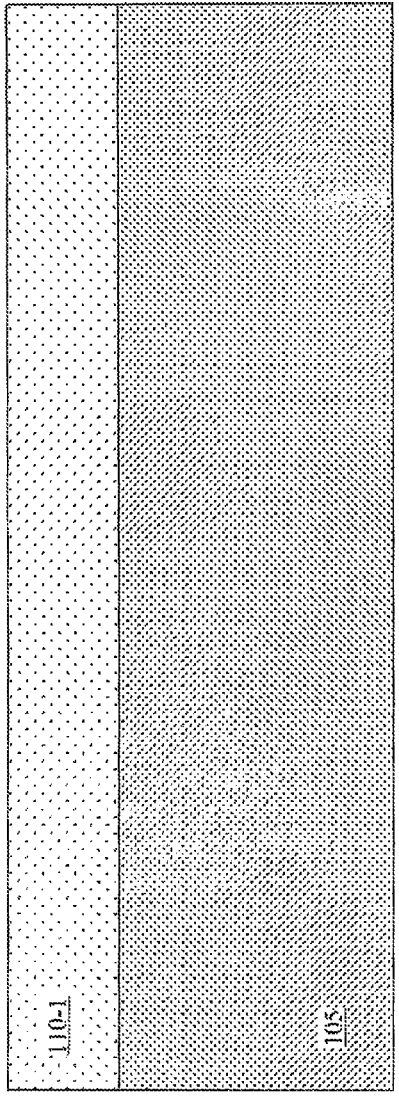
Fig. 3A Present Invention
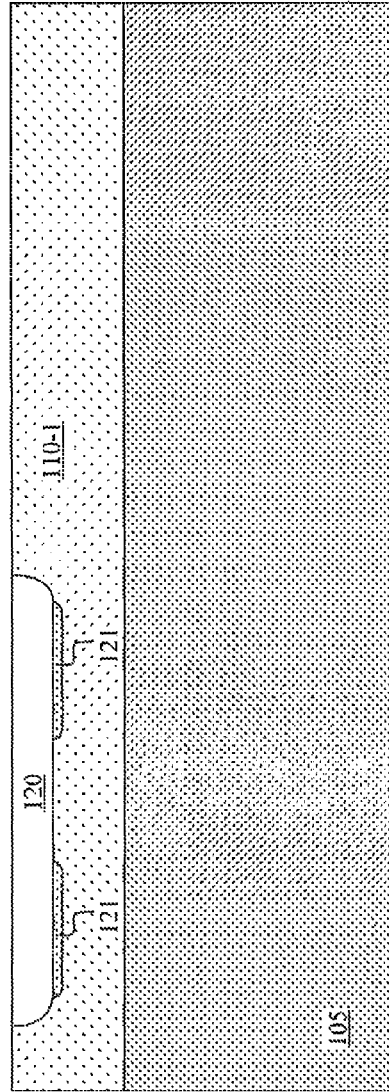
Fig. 3B Present Invention

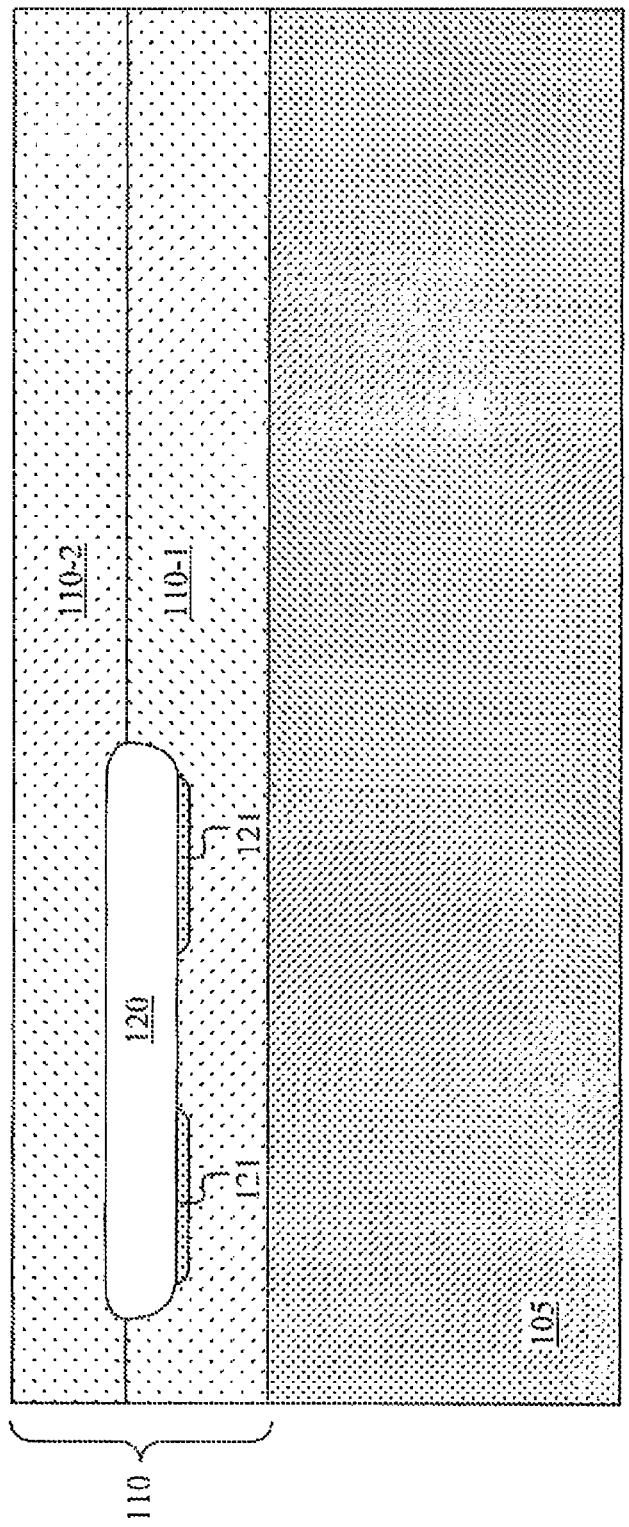
Fig. 3C Present Invention

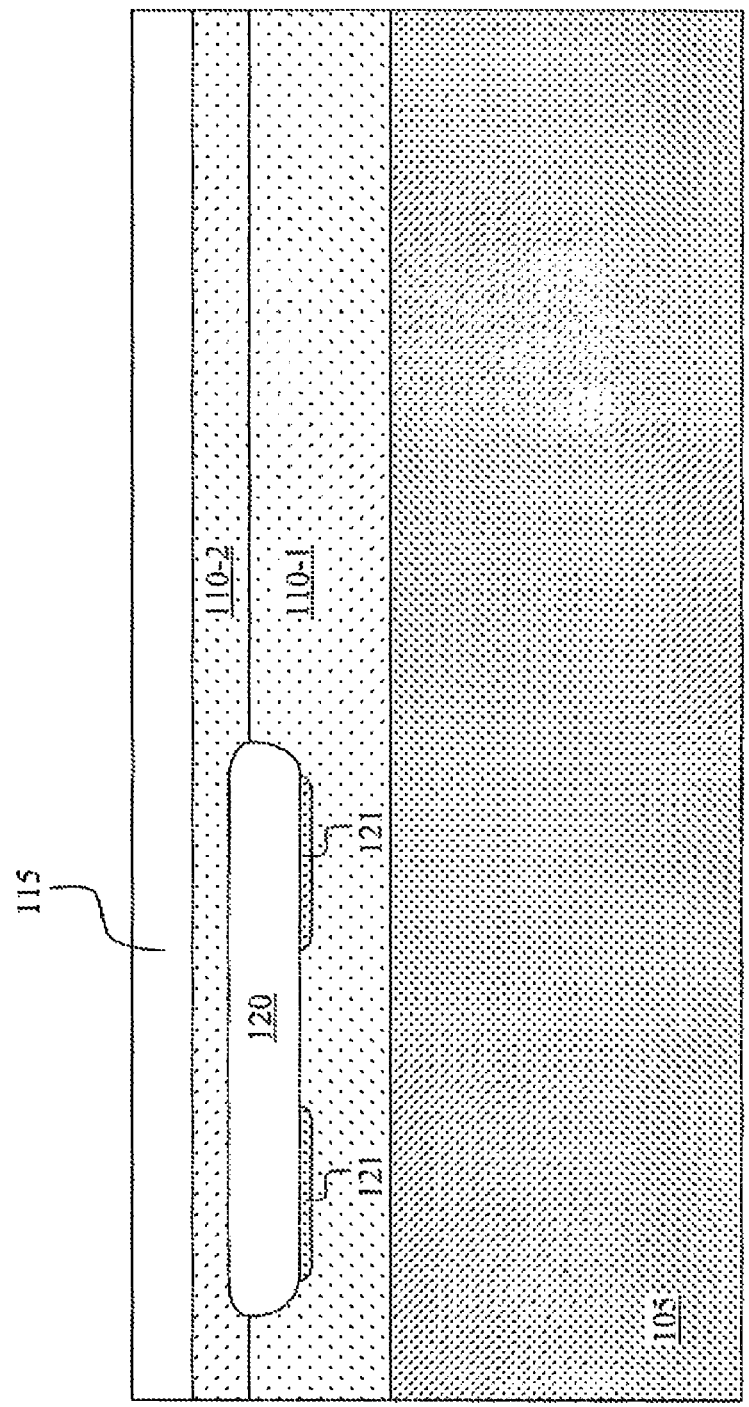
Fig. 3D Present Invention

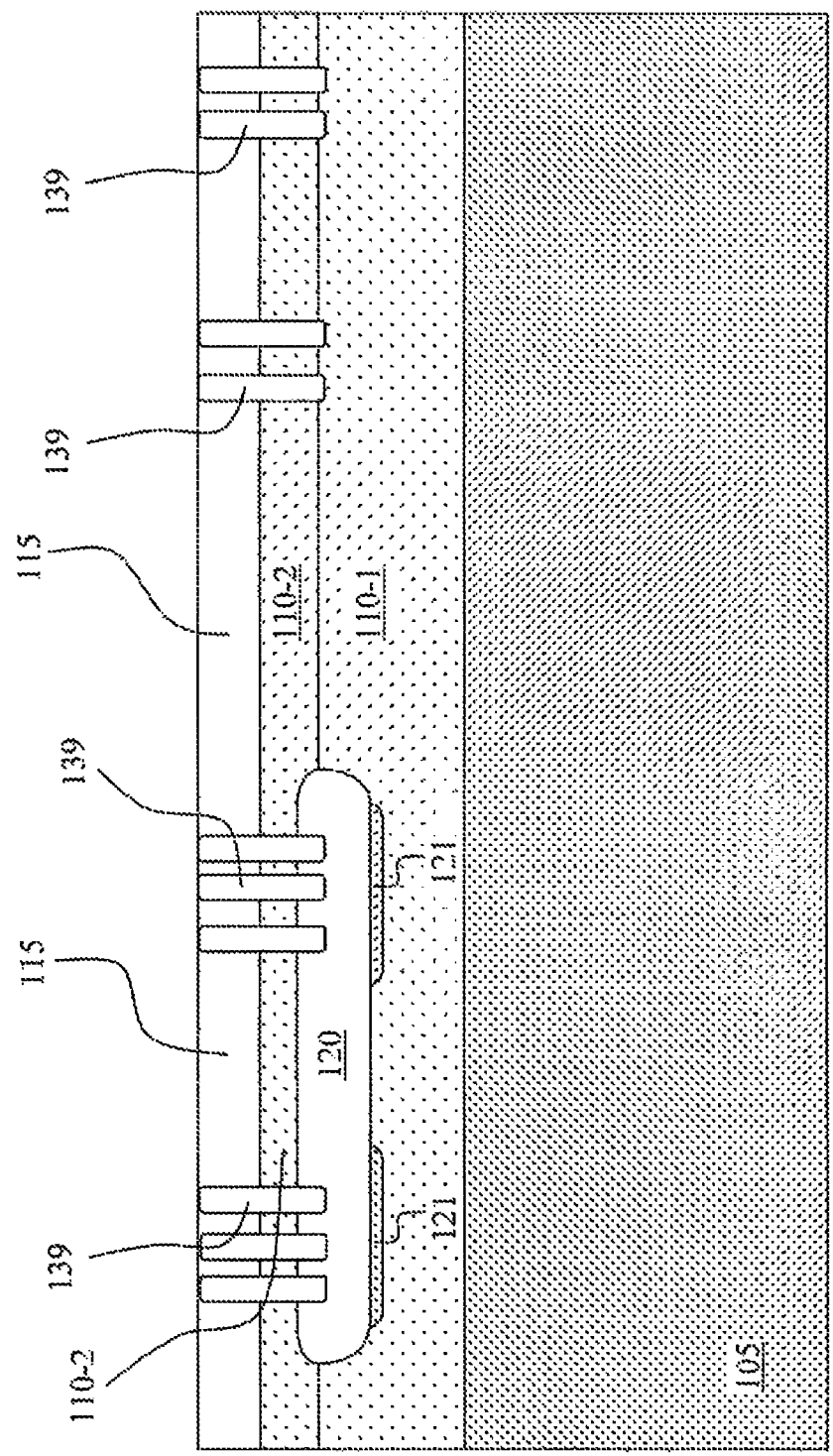
Fig. 3E Present Invention

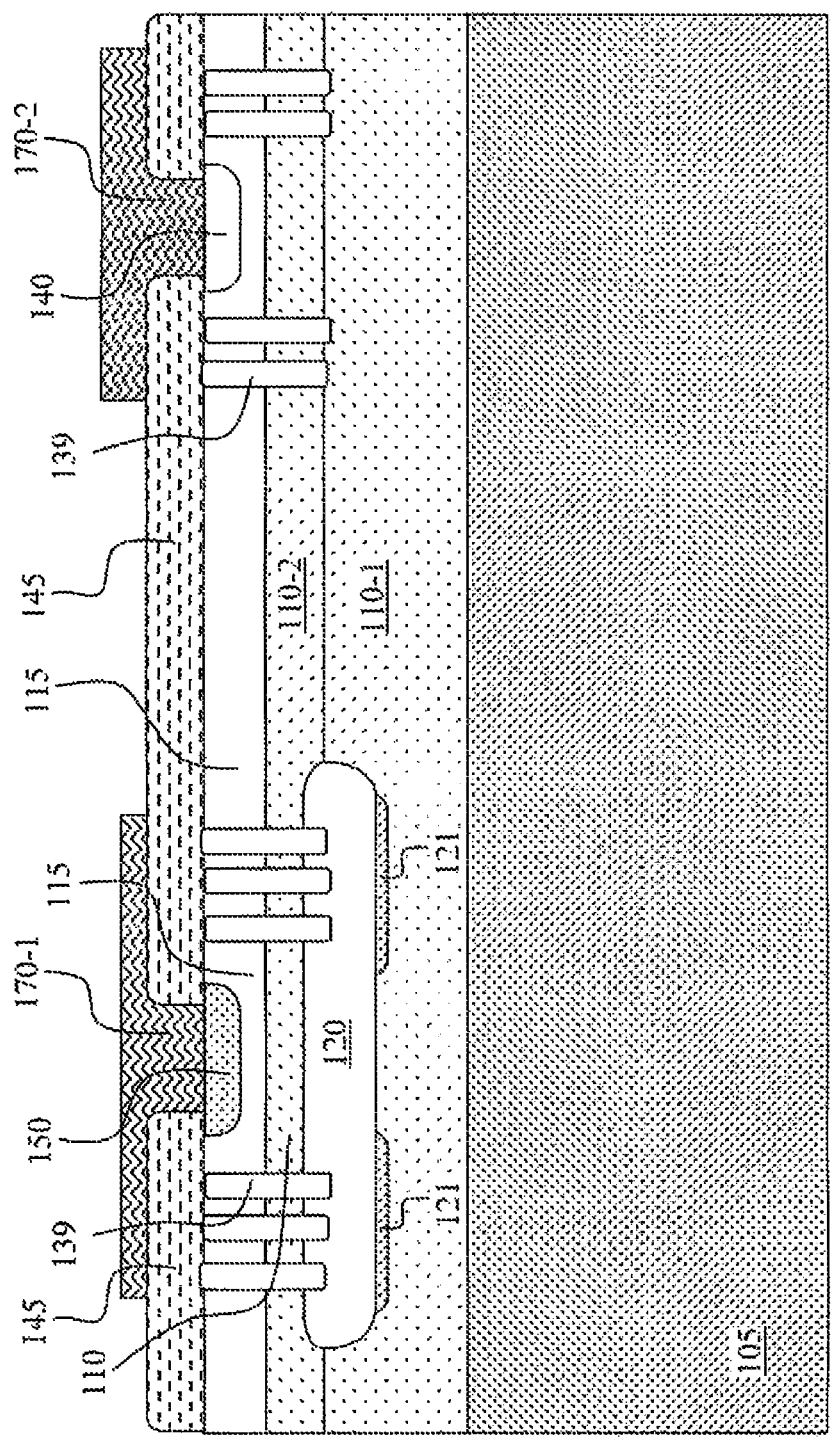
Fig. 3W Present Invention

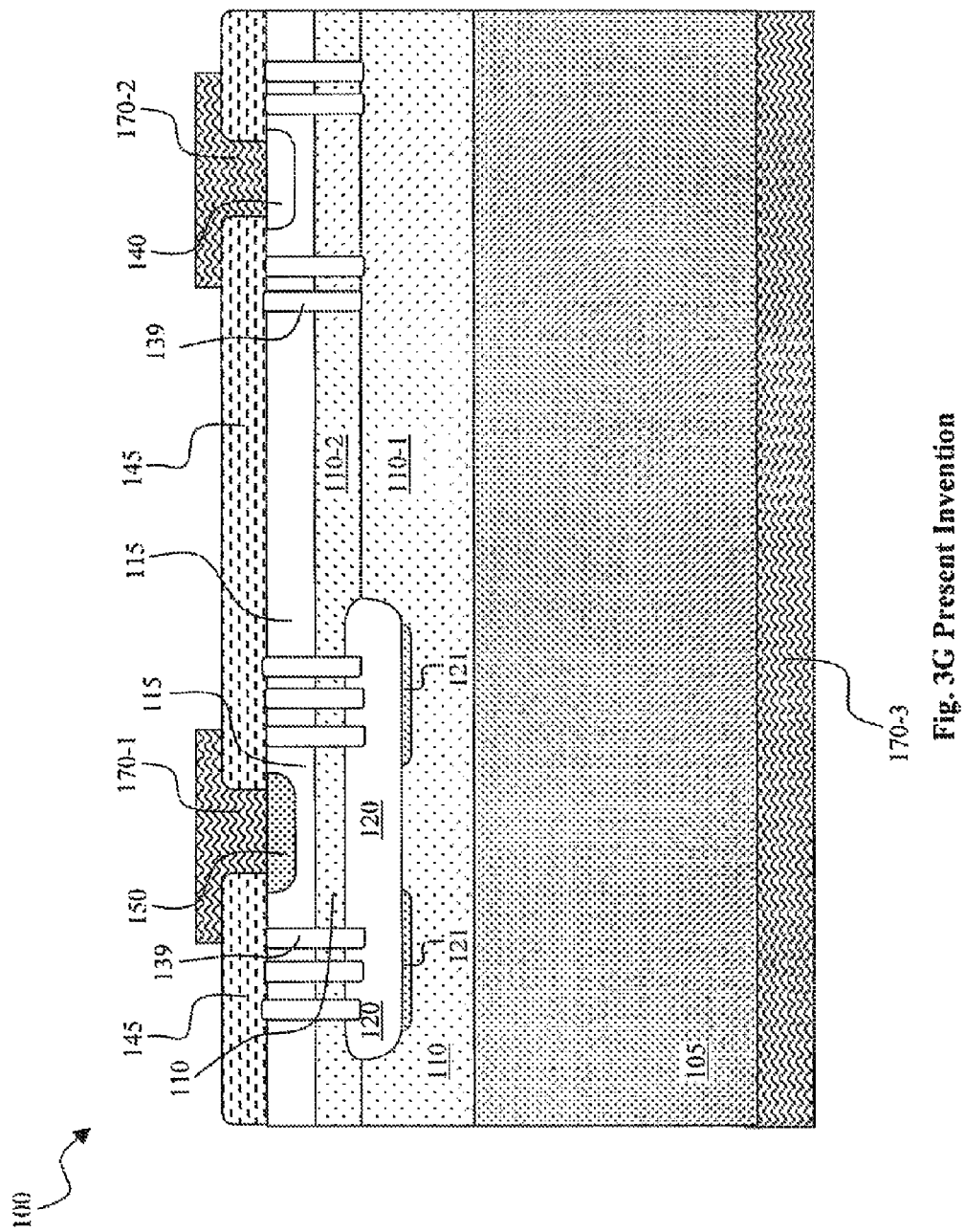
Fig. 3G Present Invention

TVS WITH LOW CAPACITANCE AND FORWARD VOLTAGE DROP WITH DEPLETED SCR AS STEERING DIODE

This application is a Divisional application, and claims priority of a pending application Ser. No. 12/384,185 filed on Mar. 31, 2009 by the common inventors of this application. The benefit of the filing dates are hereby claimed under Title 35 of the United States Code. The disclosures of application Ser. No. 12/384,185 are hereby incorporated by reference.

BACKGROUND OF THE INVENTION

1. Field of the Invention

The invention relates generally to a circuit configuration and method of manufacture of a transient voltage suppressor (TVS). More particularly, this invention relates to an improved circuit configuration and method of manufacture with simplified configuration to integrate steering diode with the Zener diode further reduce the capacitance for a transient voltage suppressor (TVS).

2. Description of the Relevant Art

The device configurations and method of manufacturing the transient voltage suppression (TVS) device are still confronted with the technical challenges to further reduce the capacitance while maintaining a simplified and low cost manufacturing process and shrinking the area occupied by the TVS chips. Specifically, the transient voltage suppressors (TVS) are commonly applied for protecting integrated circuits from damages due to the inadvertent occurrence of an over voltage imposed onto the integrated circuit. An integrated circuit is designed to operate over a normal range of voltages. However, in situations such as electrostatic discharge (ESD), electrical fast transients and lightning, an unexpected and an uncontrollable high voltage may accidentally strike onto the circuit. The TVS devices are required to serve the protection functions to circumvent the damages that are likely to occur to the integrated circuits when such over voltage conditions occur. As increasing number of devices are implemented with the integrated circuits that are vulnerable to over voltage damages, demands for TVS protection are also increased. Exemplary applications of TVS can be found in the USB power and data line protection, Digital video interface, high speed Ethernet, Notebook computers, monitors and flat panel displays.

FIG. 1A-1 shows a conventional TVS circuit implemented with diode array commonly applied for electrostatic discharge (ESD) protection of high bandwidth data buses. The TVS array includes a main Zener diode operated with a pair of steering diodes, i.e., the high side steering diode and the low side steering diode. The high side steering diode connects to the voltage source Vcc and the low side steering diode connects to the ground terminal GND with an input/output port connected between the high side and low side steering diodes. The Zener diode has a large size to function as an avalanche diode from the high voltage terminal, i.e., terminal Vcc, to the ground voltage terminal, i.e., terminal Gnd. At a time when a positive voltage strikes on one of the I/O (input/output) terminal, the high side diodes provide a forward bias and are clamped by the large Vcc-Gnd diodes. e.g., the Zener diode. The high side and low side steering diodes are designed with a small size to reduce the I/O capacitance and thereby reducing the insertion loss in high-speed lines such as fast Ethernet applications.

As an industry trend, the steering diodes are integrated with the Zener diodes. FIGS. 1A-2 and 1A-3 are two diagrams to show the integration of the steering diodes with the Zener diode. The high side and low side terminals are not visible from the outside. FIG. 1A-2 shows the integration of the high side steering diodes and low side steering diodes with a uni-directional Zener diode. To the outside, the diode unit looks like a Zener diode with very low capacitance, but internally high-side and low-side diodes are integrated with a Zener diode. The internal circuit is the same as the circuit in FIG. 1A-1. The I/O terminal is the cathode, and the GND terminal is the anode, and the VCC terminal may be internalized so that it is not noticed from the outside. FIG. 1A-3 shows the integration of the high side steering diodes and low side steering diodes with a bi-directional Zener diode circuit. However, for modern application to the electronic devices, the protection circuit implemented with such integration must be carried out without increasing the layout areas. Furthermore, they must have careful design optimization to obtain the best tradeoff between the capacitance and the forward biased voltage of the steering diodes in order to achieve a good overall voltage clamping.

FIG. 1B-1 shows a standard circuit diagram for a conventional TVS circuit and FIG. 1B-2 is a cross sectional view for showing the actual implementation of the TVS circuit applying the CMOS processing technologies to provide the TVS circuit as integrated circuit (IC) chips. As shown in FIG. 1B-2, the device is manufactured using the CMOS processing technologies to produce diodes and NPN and PNP transistors in the semiconductor substrate with the diodes and the transistors extended along a lateral direction. The TVS circuits produced by implementing the device layout and configurations thus occupy greater areas on a substrate. It is therefore difficult to miniaturize the electronic device protected by TVS circuits as shown in FIG. 1B-1 and FIG. 1B-2.

The inventor of this patent application disclosed a TVS circuit in a pending patent application U.S. Ser. No. 11/606,602 with new and improved device configuration shown in FIG. 1C. FIG. 1C shows a TVS circuit implemented with a main Zener diode formed in a P Body/N-Epi junction. The TVS circuit as shown in FIG. 1C has significant improvement by reducing the areas occupied by the device because the main Zener diode and high side diodes are now formed with a vertical configuration. This circuit uses two I/O terminals and two corresponding sets of high side and low side diodes. The high side steering diodes is further insulated from the main Zener diode with isolation trenches thus preventing inadvertent turning on of the parasitic thyristor along the lateral direction.

The inventor of this patent application disclosed another TVS circuit in another pending patent application U.S. Ser. No. 12/286,817 with new and improved device configuration shown in FIG. 1D. FIG. 1D shows a TVS circuit with a pair of steering diodes integrated with a main Zener diode wherein the high-side diode, the low-side diode and the main Zener diode are all manufactured as vertical diodes in a semiconductor substrate. The high-side diode overlaps with the main Zener diode such that the TVS now occupies significantly less area to allow for further miniaturization of the electronic devices protected by the improved TVS configuration disclosed in FIG. 1D. Optionally, the VCC metal may be left out altogether. This device employs source sinker regions to define the area of the high side diode. However, the device as shown in FIG. 1D may experience difficulties in controlling the uniformity of dopant profiles across the entire wafer to maintain consistent and accurately controllable device performance characteristics among multiple TVS chips produced from a single batch applying same manufacturing processes. Additionally, in order to further improve the device performance, there are still demands to further reduce the capacitances of the steering diodes.

Therefore, a need still exists to simplify the device configuration such that the TVS devices can be manufactured with more controllable and uniform doping profiles and device characteristics. Also, there are additional requirements to further reduce the capacitance of the steering diodes. In order to achieve these purposes, there are demands to provide new and improved device configurations with new structural layout and manufacturing method to achieve these goals.

SUMMARY OF THE PRESENT INVENTION

It is therefore an aspect of the present invention to provide an improved TVS structural configurations implemented with high-side diode, low-side diode functioning as a pair of steering diodes. The steering diodes are integrated with a main Zener diode wherein the high-side diode, the low-side diode and the main Zener diode are all manufactured as vertical diodes in a semiconductor substrate with simplified layer structures. The high-side diode overlaps with the main Zener diode such that the TVS device occupies significantly less area. Meanwhile, the device configuration is improved by forming multiple PN junctions with a laterally extended N-buried layer in a P epitaxial layer below a N– top dopant layer and a P+ contact region to constitute a bottom Zener diode and simultaneously function as a semiconductor controlled rectifier (SCR) acting as a high side steering diode. The device further significantly reduces the capacitance because of the series connection of the equivalent capacitances formed by the PN junctions of the SCR. In a preferred embodiment, the N– top dopant layer has low doping, which further decreases the capacitance. Preferably, the N– top dopant layer portion of the SCR is floating and completely depleted at a zero bias so that the SCR functions like a normal diode with low capacitance. Therefore, the above discussed technical difficulties and challenges are resolved.

Briefly in a preferred embodiment this invention discloses a transient-voltage suppressing (TVS) device disposed on a semiconductor substrate of a first conductivity type. The TVS includes a buried dopant region of a second conductivity type disposed and encompassed in a epitaxial layer of the first conductivity type wherein the buried dopant region extending laterally beyond the region of the high side steering diode and having an extended bottom junction area interfacing with the epitaxial layer thus constituting a Zener diode for the TVS device. The TVS device further includes a region above the buried dopant region further comprises a top dopant layer of a second conductivity type and a contact region of a first conductivity type at the top surface in combination with the epitaxial layer and the buried dopant region to form a plurality of interfacing PN junctions constituting a SCR. The SCR may act as a first steering diode to function with the Zener diode and a second steering diode for suppressing a transient voltage. The second steering diode may be formed laterally away from the first steering diode and the Zener diode. The second steering diode is formed as a PN junction between a contact region of a second conductivity type and the epitaxial layer of the first conductivity type. In a preferred embodiment, the top dopant layer may encompass the contact region of the second conductivity type of the second steering diode so that the PN junction of the second steering diode is formed between the top dopant layer and the epitaxial layer instead of between the contact region and the epitaxial layer, and the lower doping of the top dopant layer resulting in a lower capacitance for the second steering diode. Insulation trenches may be formed to isolate and define the areas of the steering diodes. In an exemplary embodiment, the multiple PN– junctions in the region above the buried dopant region further stacking vertically with the buried dopant region as a plurality of capacitances connected in series to configure the SCR with a reduced junction capacitance. In another exemplary embodiment, the SCR further comprises a dopant profile to have a configuration of a depleted SCR structure wherein the top dopant layer of the second conductivity type layer of the SCR is completely depleted at zero bias by the top contact layer and the epitaxial layer portion of the SCR. This is achieved by designing the doping concentrations and widths of the top dopant layer and of the other portions of the SCR, and is useful in eliminating undesired characteristics of typical SCRs such as unwanted latch up triggering and snap-back characteristics in the SCR I-V characteristics. The depleted SCR instead acts like a normal diode with very low capacitance. In a preferred embodiment, the contact region of the first conductivity type is highly doped, the top dopant layer of second conductivity type is lowly doped, the epitaxial layer of first conductivity type is lowly doped, and the buried dopant region of the second conductivity type is highly doped to form a vertical P+/N–/P–/N+ (or N+/P–/N–/P+) SCR structure.

This invention further discloses a method for manufacturing a transient voltage suppressing (TVS) device. The method includes steps of a) growing a epitaxial layer having a first conductivity type on a semiconductor substrate of the first conductivity type and implanting a buried dopant region having a second conductivity type with a lateral extension in the epitaxial layer—the buried dopant region may be implanted after growing half of the epitaxial layer of the first conductivity type; b) forming a top dopant layer having second conductivity type at the top of the epitaxial layer c) forming contact regions at the top surface of the top dopant layer for forming a silicon controlled rectifier (SCR) combined with a steering diode structure with a vertically stacked PN junctions having equivalent capacitances connected in series having a reduced capacitance. In a more specific embodiment, the method may further include a step of opening a plurality of opening trenches through the epitaxial layer into the buried dopant region to form isolated trenches with the buried dopant region extended laterally beyond and below the isolation section. The method may also include forming insulation layer over the top dopant layer and opening an input/output (I/O) contact openings in the insulation layer to expose a top surface of the top dopant layer. The top dopant layer may be implanted at the top of the epitaxial layer of first conductivity type or epitaxially grown over the epitaxial layer of first conductivity type. In a more specific embodiment, the top dopant layer may be blanket implanted into the top of the epitaxial layer of first conductivity type.

These and other objects and advantages of the present invention will no doubt become obvious to those of ordinary skill in the art after having read the following detailed description of the preferred embodiment, which is illustrated in the various drawing figures.

BRIEF DESCRIPTION OF THE DRAWINGS

FIGS. 1A-2 and 1A-3 are two diagrams to show the integration of the steering diodes with the Zener diode to achieve low capacitance in unidirectional and bi-directional blocking TVS diodes respectively.

FIG. 1B-1 shows a standard circuit diagram for a conventional TVS circuit and FIGS. 1B-2 is a cross sectional view for showing the actual implementation of the TVS circuit applying the CMOS processing technologies to provide the TVS circuit as integrated circuit (IC) chips.

FIG. 2A is a cross sectional view of the integrated Zener diode with the depleted SCR high side structure and the low side steering diode of this invention formed using a buried N+ layer in a P type epitaxial region, with the addition of P and N type regions implanted from the top surface. The SCR is formed by a P+/N−/P−/P+ doping profile, to achieve a lower junction capacitance.

FIG. 2A-1 shows the equivalent circuit of this device structure.

FIG. 2B is a close up view taken from the top of FIG. 2A showing the equivalent capacitances of the circuit. FIG. 2C is the same cross sectional view as shown in FIG. 2A, but with the conductivity types reversed.

FIGS. 3A to 3G are cross sectional views for illustrating the forming of the NBL and the trigger implant layer.

DETAILED DESCRIPTION OF THE METHOD

Figures 1, 1A:
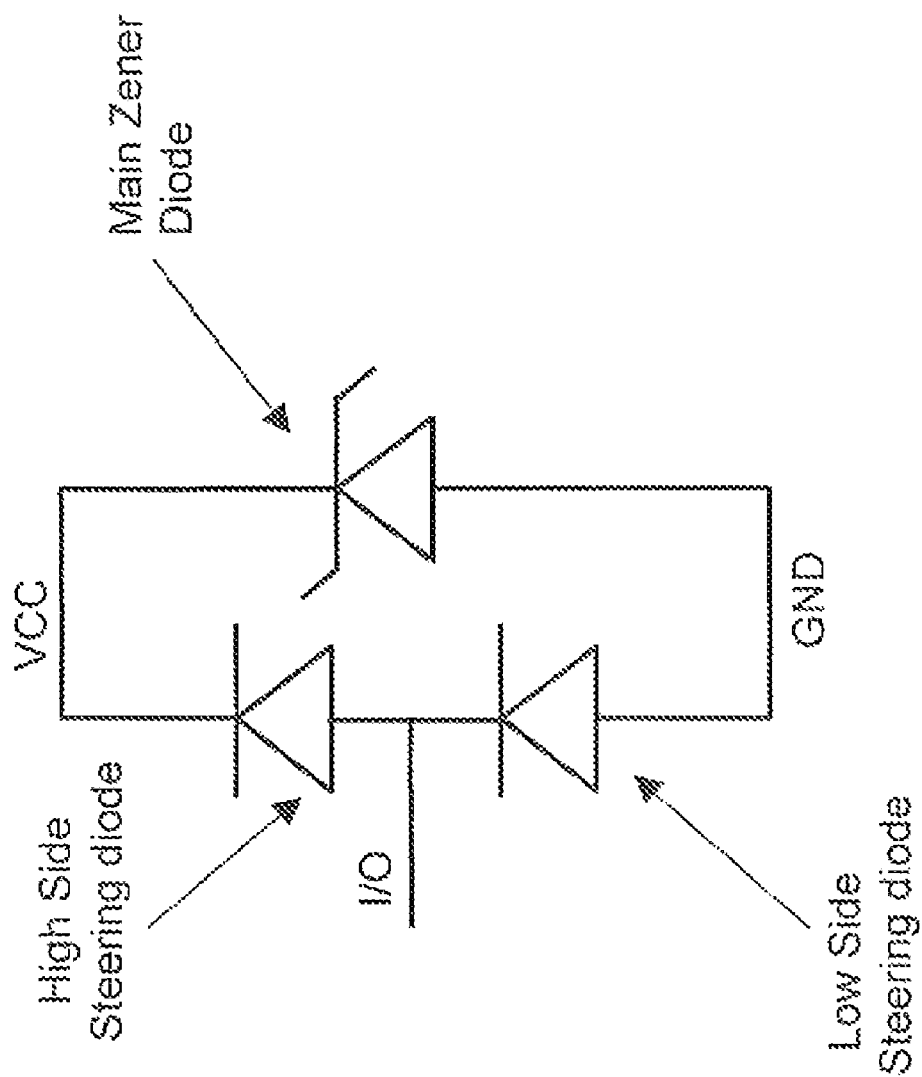
FIG. 1A-1 shows the circuit of a conventional TVS circuit implemented with diode array commonly applied for electrostatic discharge (ESD) protection.

Refer to FIG. 2A for a side cross sectional view illustrated with equivalent circuit of a transient voltage suppressor (TVS) 100 of this invention. The TVS device as shown is formed with a depleted SCR high side structure using a buried N+ layer in a P type epitaxial region, with the addition of P and N type regions implanted from the top surface. The low side diode is formed by a P+/N−/P−/N+ (or N+/N−/P−/P+) doping profile, to achieve a lower junction capacitance. Specifically, the TVS 100 is formed on a heavily doped P+ semiconductor substrate 105 which supports a lightly doped P-epitaxial layer 110. An N− top dopant layer 115 is located at the top of P-epitaxial layer 110. The TVS 100 includes a P+ contact region 150 formed near a top surface of the semiconductor substrate, above the N buried region 120, to enhance the electrical contact with the I/O pad 170-1. The TVS 100 further includes an N+ buried region 120 formed in the P-epitaxial layer 110. A semiconductor controlled rectifier (SCR) 130-1 is formed between the P+ contact region 150 and the N+ buried layer 120, and acts as the first steering diode, which in this case is the high side steering diode. The SCR 130-1 is formed vertically from P+ contact region 150 to N− top dopant layer 115 to P-epi region 110 to N+ buried layer 120. The N+ buried region 120 is formed with an extended length beyond isolation trenches 139 to function with the P-epitaxial layer 110 below it as the main Zener diode 130-3 for the TVS device. This structure uses deep isolation trenches to define the boundary of the high side diode. This reduces the sidewall P-N junction capacitance resulting from the use of N+ sinkers. The isolation trenches also help avoid parasitic transistor action. The isolation trenches are filled with a dielectric such as oxide, which has a lower dielectric constant compared to silicon in order to further reduce any sidewall coupling capacitance. The presence of oxide filled trenches also plays an important role in reducing the I/O-pad to substrate ground capacitance. The I/O-Pad capacitance is further reduced by the use of multiple isolation trenches in this device structure. In an alternative embodiment, the isolation trenches 139 may comprise a polysilicon center enclosed by oxide. The oxide filled trenches 139 may be placed surrounding the first steering diode 130-1 in the areas where the first I/O pad 170-1 is located to help reduce the I/O pad to substrate ground capacitance. A Zener diode 130-3 overlapping zone is optionally formed with a deep voltage breakdown (VBD) trigger implant layer 121 implanted with P+ dopant ions disposed between the epitaxial layer 110 and the N+ buried layer 120 disposed below a top N-layer 115 to control the voltage breakdown.

An N+ doped contact region 140 is formed on top of a second steering diode 130-2 (which in this configuration is the low side steering diode) formed between the P− epitaxial layer 110 and the N− top dopant layer 115. The N+ contact region 140) is formed to enhance the electrical contact with another I/O pad 170-2. The second steering diode is connected to the Zener diode through the heavily doped semiconductor substrate 105. The low side steering diode 130-2 is isolated from the high side steering diode 130-1 in the semiconductor regions by lateral distance and isolation trenches 139 to prevent a latch up in the semiconductor regions between different I/O terminals. The I/O terminals 170-1 and 170-2 may be connected in a third dimension (not shown). An oxide insulation layer 145 covering the top surface has openings to allow the I/O pads 170-1 and 170-2 to make contact to contact regions 150 and 140, respectively, and to allow a Vcc pad (not specifically shown and optional) through a sinker region or other means (not shown) to contact the N buried layer 120 high-side diode and Zener diode overlapping zone.

FIG. 2A-1 shows an equivalent circuit of the TVS device 100 of FIG. 2A. To the outside, the TVS device 100 looks and acts like a single Zener diode 130-4 having low capacitance, but internally it comprises a main Zener diode 130-3 working in conjunction, with a high side steering diode 130-1 and a low side steering diode 130-2.

The TVS device as shown in FIG. 2A is configured as a depleted SCR device by the PNPN junctions between the P+ region 150, the N− top layer 115, the P− epitaxial layer 110 and the N+ buried layer 120. The N layer 115 and P regions 150, 110 in the SCR 130-1 are configured with dopant profiles such that the N dopant layer 115 within the SCR is completely depleted at zero bias by the adjacent P regions 150 and 110, so that the depleted SCR 130-1 acts like a normal diode. In addition, the middle P and N regions 110 and 115 of the SCR 130-1 are isolated by the isolation trenches 139, so there is no danger of unwanted triggering or latch-up of the SCR 130-1. Optionally, the SCR may be configured so that the P-epi 110 portion of the SCR is also depleted. The TVS device as shown has the benefit of significantly reduced capacitance because of the extra junctions formed between these PN interfacial layers, as shown in FIG. 2B. In the prior art, the high side diode only comprised a single PN junction. The capacitance from this single junction could be undesirably high, and at risk to process variations. In this invention the SCR 130-1 has three PN junctions, with three corresponding capacitances 135-1, 135-2 and 135-3 in series, resulting in a low equivalent capacitance. Also, the doping concentrations of the regions 115 and 110 comprising the PN junctions of the capacitances 135-2 and half of the PN junction of capacitance 135-1 are very low, which also results in a low capacitance. The forward conduction is similar to the conduction of a single diode since the three PN junctions are washed out by a high level of minority carrier injection. The forward voltage drop is lower than a TVS device implemented with two high side steering diodes connected in series (which is a conventional method of reducing the capacitance of a diode), and in addition the TVS of this invention requires less area than the two-series steering diodes. The TVS device of this invention has the additional benefit in lowering the capacitance of the second (low side) steering diode 130-2. Without N− top dopant layer 115, the PN junction of the low side steering diode 130-2 would be between the N+ contact region 140 and the P-epi 110 resulting in a relatively high capacitance. In this invention, that PN junction is shifted to between the N− top dopant layer 115 and the P− epi 110, resulting in a lower capacitance due to the lower doping concentration of N− top dopant layer 115. The TVS device as shown can also be conveniently integrated and manufactured by applying standard manufacturing processes. As shown in the manufacturing processes below, compared with the conventional TVS devices, there are no extra masks required. The P-epi layer 110 may further comprise a bottom P-epi layer and a top P-epi layer, as will be shown in the method.

The TVS device of this invention can also be formed using opposite conductivity types compared to those shown in FIG. 2A. In FIG. 2C, a TVS device 100' is shown where the conductivity types of each region are reversed. For example, the substrate 105 is now N+ rather than P+ and the buried layer 120 is now P+ rather than N+. The polarities of the steering diodes 130-1' and 130-2', and Zener diode 130-3' are also reversed. The first steering diode 130-1' is still a depleted SCR, and serves as the high side steering diode, and is formed vertically up from P+ buried layer 120 to N− epi 110, to P− top dopant layer 115 to N+ contact region 150. The second steering diode 130-2' acts as the low side diode. The main Zener diode 130-3' is in the same relative position but has a reversed polarity, being formed from the P+ buried layer 120 to the N− epi layer 110 below. Also the bottom electrode 170-3 now functions as the Vcc terminal while a top electrode (not specifically shown) is electrically connected to the P+ buried layer 120 to function as the ground terminal.

Figures 1, 1A, 2, 3:
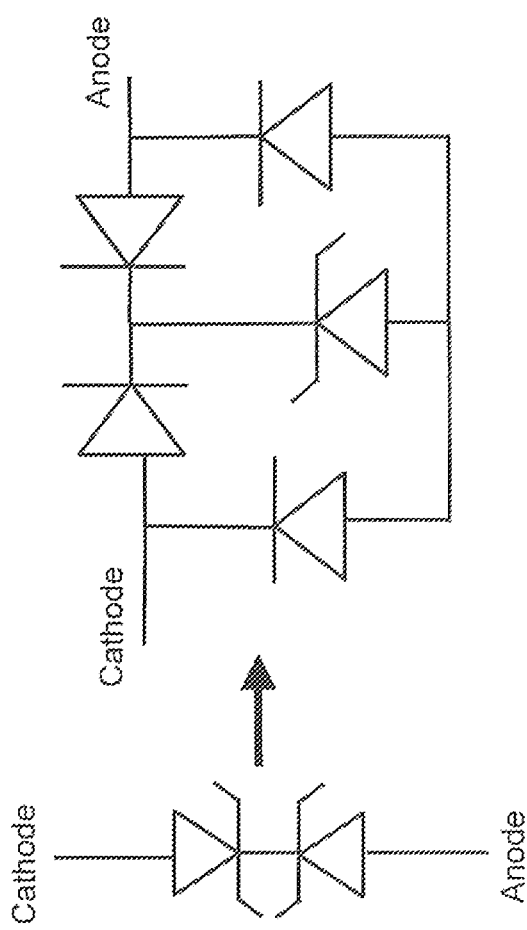
Figures 1, 1B:
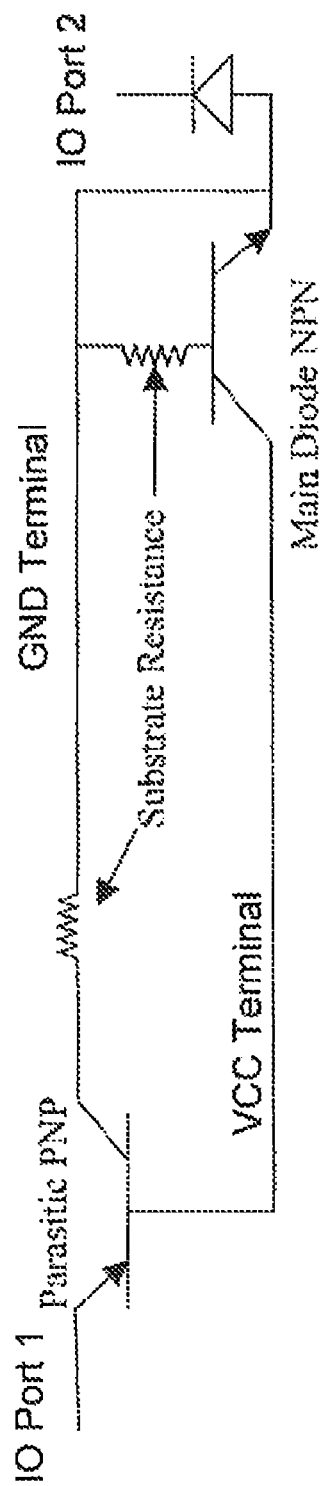
Figures 1, 1B, 2:
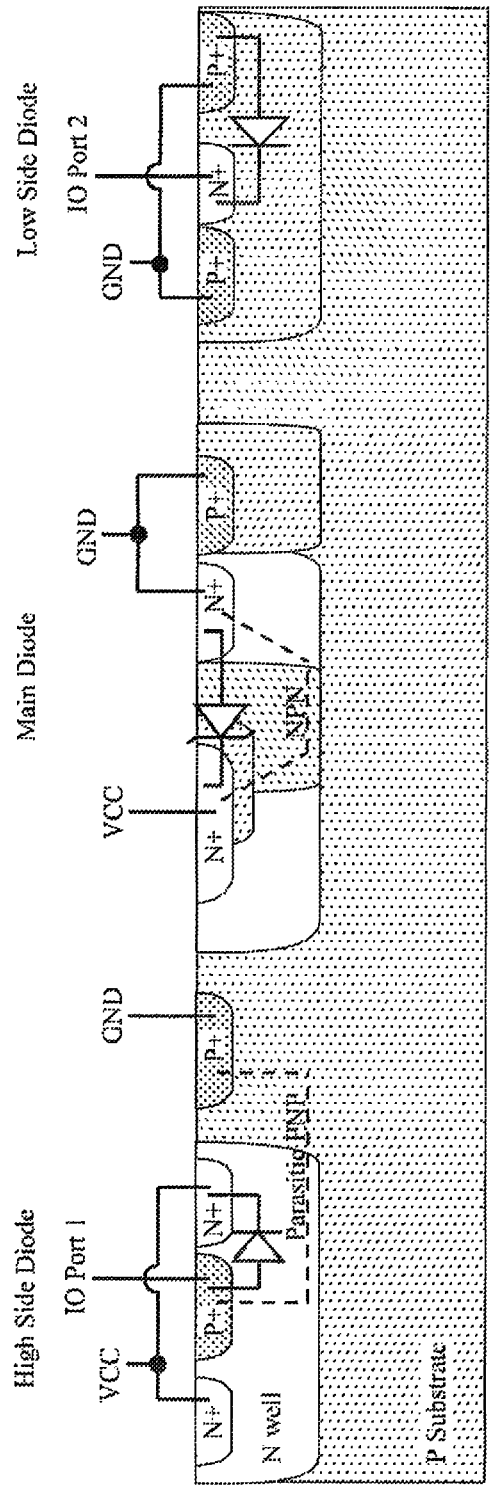
Figure 1C:
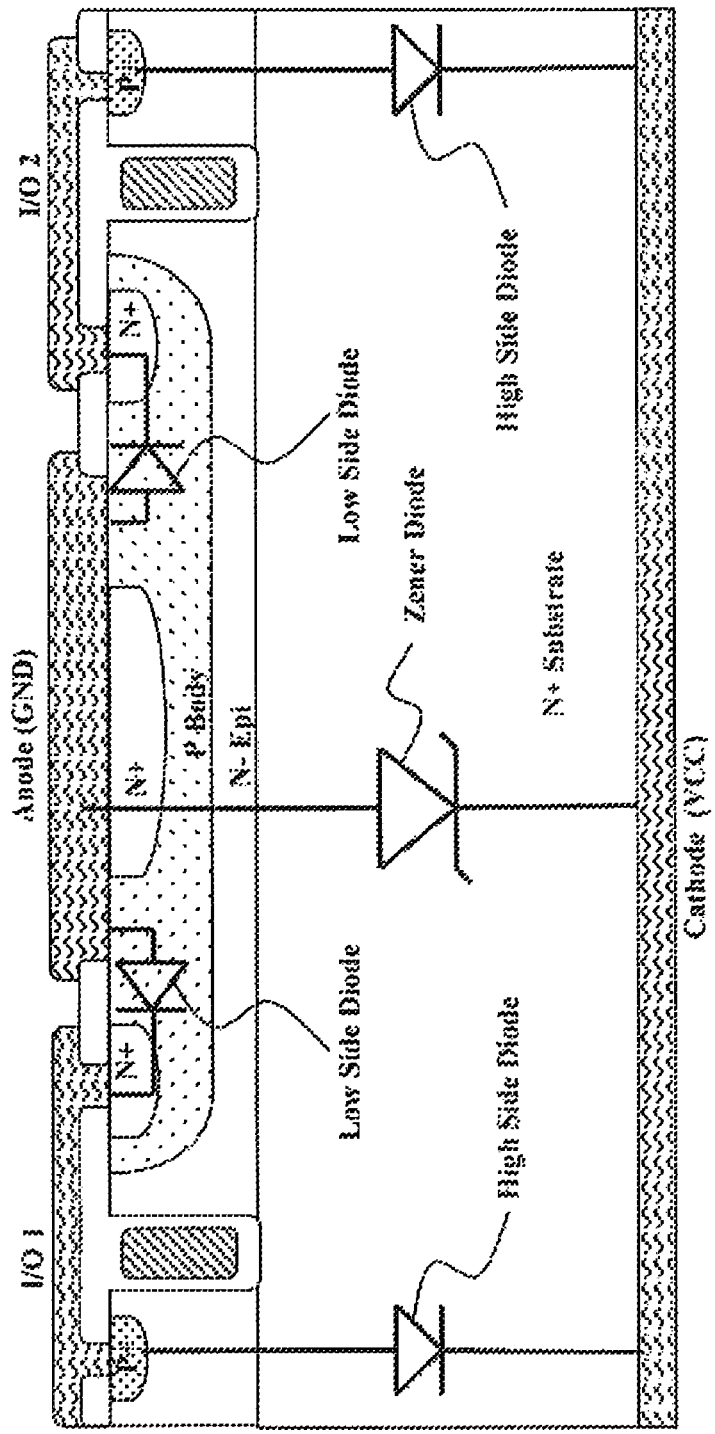
FIG. 1C shows a TVS circuit implemented with some of the diodes formed as vertical diodes to reduce the size of the TVS circuit.
Figure 1D:
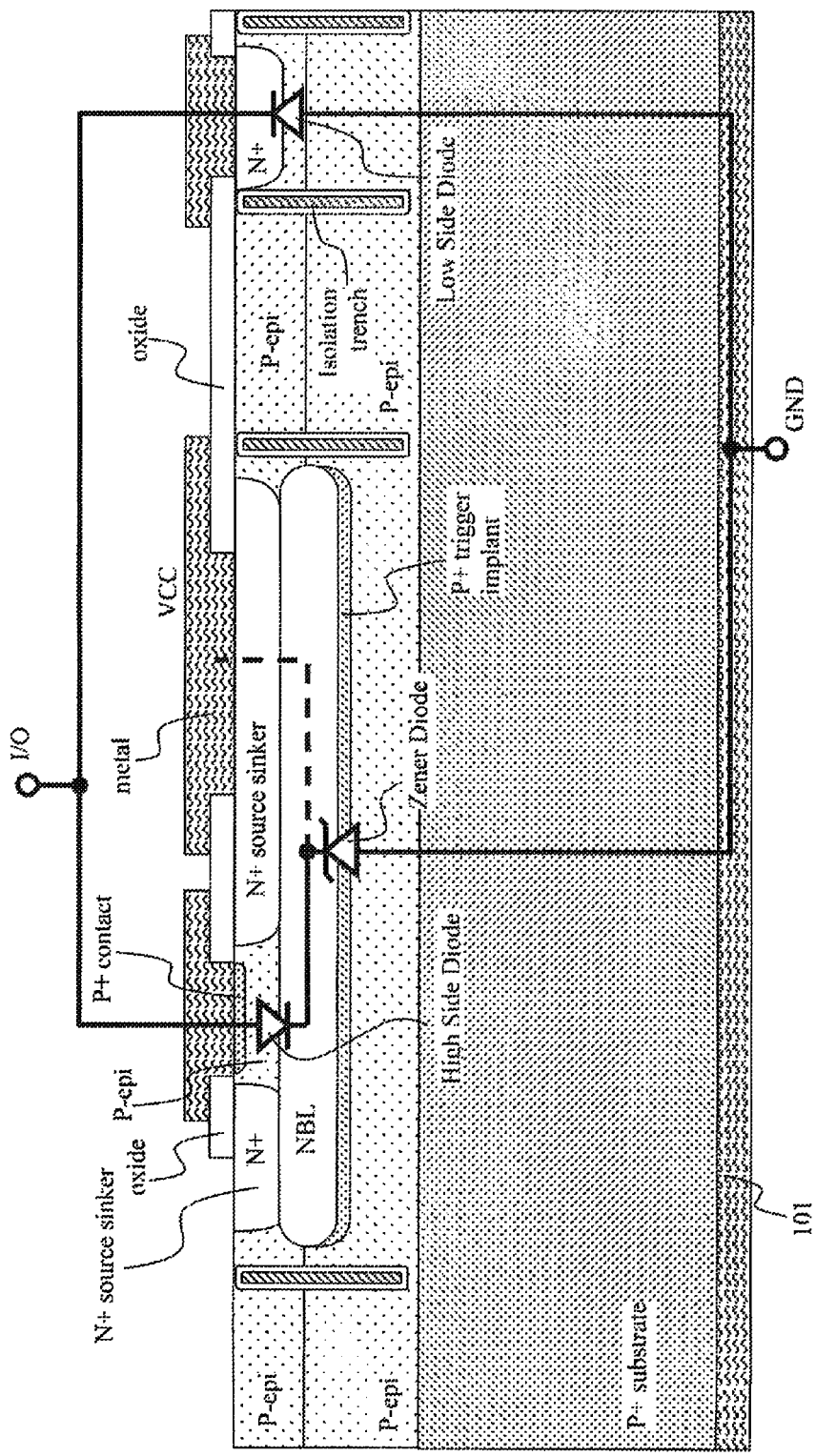
FIG. 1D is a cross sectional view of the integrated Zener diode with the high side and low side steering diodes illustrated with equivalent circuits of TVS devices implemented with N+ buried layer and isolation trenches to form vertical TVS diode arrays to reduce the areas occupied by the diode array.

FIGS. 3A to 3G are a series of cross sectional views for illustrating the processing steps to manufacture the low capacitance TVS with depleted SCR as shown in FIG. 2 of this invention. FIG. 3A shows a heavily doped P+ substrate 105 with a lightly doped bottom P-epi layer 110-1 grown over it. In FIG. 3B, a masked implant (mask not shown) is performed to form the N+ implant region 120 and P+ trigger implants 121. In FIG. 3C, the top P-epi layer 110-2 is grown over the bottom P-epi layer 110-1, and collectively form the P-epitaxial layer 110. In FIG. 3D a blanket implant is performed to form N-layer 115 at the top of the top P-epitaxial layer 110-2. In FIG. 3E, a trench mask (not shown) is applied to open the isolation trenches 139 followed by filling the trenches with insulation material (which may include a polysilicon center). In FIG. 3F, implant masks (not shown) are applied to form the N+ contact regions 140 and P+ contact regions 150 near the top surface of the N− top dopant layer 115 to function as the low side and high side diodes. The top dopant layer 115 may be formed either by implantation, or by epitaxial growth. If top dopant layer 115 is formed by blanket implantation or epitaxial growth, this TVS device requires no extra masks compared to a similar TVS device not employing a depleted SCR. The configuration (e.g., doping profile, region widths) of the SCR may be selected so that the SCR is depleted at a zero bias. The manufacturing processes proceed with the formation of the top insulation layer 145 and the Input/Output pads 170-1 and 170-2. In FIG. 3G, a bottom electrode 170-3 may be formed under the P+ substrate 105 as the GND pad to complete the manufacturing processes of the TVS device.

According to above descriptions, this invention discloses a transient voltage suppressing (TVS) device disposed on a semiconductor substrate of a first conductivity type. The TVS device comprises an epitaxial layer of the first conductivity type disposed on top of the semiconductor substrate and a top dopant layer of a second conductivity type disposed at the top of the first epitaxial layer. The TVS device further comprises a buried dopant region of the second conductivity type disposed and encompassed in the epitaxial layer wherein the buried dopant region extends laterally and having an extended bottom junction area interfacing with the underlying regions of the epitaxial layer thus constituting a Zener diode for the TVS device. And, the TVS device further comprises a contact region of the first conductivity type disposed at the top surface of the top dopant layer for constituting a semiconductor controlled rectifier (SCR) acting as a high-side steering diode structure with the multi-junction configuration having a reduced capacitance. The reduced capacitance is because of the SCR having three PN junctions stacked as multiple capacitances connected in series, rather than a single capacitance from a single PN junction. In a preferred embodiment, the SCR is configured so that its top dopant layer portions are depleted at zero bias, so that the SCR behaves like a normal diode with low capacitance. In an exemplary embodiment, the TVS device further includes isolation trenches for isolating a section of the semiconductor substrate for disposing the SCR combined with the high side steer diode structure. In another exemplary embodiment, the top contact region of the first conductivity type disposed in the top dopant layer is disposed at a top surface of the semiconductor substrate for enhancing an electric contact to an input/output (I/O) pad contacting the top surface above the top contact region. In another exemplary embodiment, the TVS device further includes a second top contact region of the second conductivity type disposed in the top dopant layer laterally away from the high side diode constituting a low-side steering diode for side TVS device with capacitors configured as connection in series by stacking the second top contact region and the top dopant layer and the epitaxial layers. In another exemplary embodiment, the second top contact region of the second conductivity type disposed in the second epitaxial layer is disposed at a top surface of the semiconductor device for enhancing an electric contact to a second input/output (I/O) pad contacting the top surface above the second top contact region. In another exemplary embodiment, the TVS device further includes high-side low-side isolation trenches disposed between the SCR acting as the high side steering diode structure and the low side steering diode. In another exemplary embodiment, the first conductivity type is a P-type. In another exemplary embodiment, the first conductivity type is N-type. In another exemplary embodiment, the TVS device further includes a voltage breakdown (VBD) trigger zone formed with a high dopant concentration of first conductivity type in a Zener diode overlapping zone disposed in the first epitaxial layer below the buried dopant region to control a voltage breakdown. In another exemplary embodiment, the TVS device further comprises an insulation covering a top surface of the semiconductor having openings above the top contact regions for forming the I/O pads in contact with the top contact regions. In another exemplary embodiment, the TVS device further comprises an insulation covering a top surface of the semiconductor having an opening above the top dopant layer to form a metal layer in electric connection to a high voltage Vcc for connecting the SCR acting as the high side steering diode structure and the Zener diode to high voltage Vcc. In another exemplary embodiment, the first conductivity type is a P-type; and a bottom surface of the substrate constituting a N+ substrate is connected to a ground voltage Gnd. In another exemplary embodiment, the first conductivity type is a N-type conductivity type; and a bottom surface of the substrate constituting a N-type substrate is connected to a high voltage Vcc. In another exemplary embodiment, the buried dopant region encompassed in the epitaxial layer further extending laterally beyond the isolation trenches having an extended bottom junction area to form the Zener diode with an extended PN-junction area. In another exemplary embodiment, the SCR further comprises a dopant profile to have a configuration of a depleted SCR structure wherein the second conductivity type layer of the SCR is completely depleted by the top contact layer, and the third layer formed as an epitaxial layer of opposite conductivity type. This is achieved by designing the doping concentration and width of the second conductivity type layer of the SCR, and is useful in eliminating snap-back characteristics in the SCR I-V characteristics. In a preferred embodiment, the contact region of the first conductivity type is highly doped, the top dopant layer of second conductivity type is lowly doped, the epitaxial layer of first conductivity type is lowly doped, and the buried dopant region of the second conductivity type is highly doped to form a vertical P+/N−/P−/N+ (or N+/P−/N−/P+) SCR structure.

Although the present invention has been described in terms of the presently preferred embodiment, it is to be understood that such disclosure is not to be interpreted as limiting. Various alterations and modifications will no doubt become apparent to those skilled in the art after reading the above disclosure. Accordingly, it is intended that the appended claims be interpreted as covering all alterations and modifications as fall within the true spirit and scope of the invention.

We claim:

1. A transient voltage suppressing (TVS) device comprising:
   a semiconductor substrate of a first conductivity type;
   an epitaxial layer of the first conductivity type disposed on top of said semiconductor substrate and a top dopant layer of a second conductivity type disposed at the top of said epitaxial layer;
   a buried dopant region of the second conductivity type disposed and encompassed in the epitaxial layer wherein said buried dopant region interfacing with underlying portions of said epitaxial layer thus constituting a Zener diode for said TVS device; and
   a first contact region of the first conductivity type disposed at the top of said top dopant layer over said buried dopant region for constituting a semiconductor controlled rectifier (SCR) functioning as a first steering diode, wherein said SCR comprises vertically of the first contact region, the top dopant layer, the epitaxial layer, and the buried dopant region.

2. The transient voltage suppressing (TVS) device of claim 1 further comprising:
   a plurality of isolation trenches isolating a section of said epitaxial layer and top dopant layer for isolating said SCR.

3. The transient voltage suppressing (TVS) device of claim 1 further comprising:
   a second contact region having second conductivity type disposed at the top of said top dopant layer and laterally away from the SCR and first steering diode wherein said second contact region interfacing with the top dopant layer for functioning as a second steering diode for functioning with said first steering diode as a pair of steering diodes of said TVS device.

4. The transient voltage suppressing (TVS) device of claim 1 further comprising: a second steering diode formed laterally away from the SCR and first steering diode, wherein said first and second steering diodes form a pair of steering diodes, said pair of steering diodes comprising a high side steering diode and a low side steering diode.

5. The transient voltage suppressing (TVS) device of claim 3 wherein:
   the second steering diode further includes a part of the top dopant layer for reducing the capacitance of said second steering diode.

6. The TVS device of claim 3 wherein:
   the first and second steering diodes are connected to a first and second input/output (I/O) pads through the first and second contact regions, respectively.

7. The TVS device of claim 6 further comprising:
   isolation trenches surrounding the first and second steering diodes and disposed under the first and second I/O pads.

8. The transient voltage suppressing (TVS) device of claim 4 wherein:
   the first steering diode and the said second steering diode are separated by at least one isolation trench.

9. The transient voltage suppressing (TVS) device of claim 1 wherein:
   said first conductivity type is P-type, and the first steering diode is a high side steering diode.

10. The transient voltage suppressing (TVS) device of claim 1 wherein:
    said first conductivity type is N-type, and the first steering diode is a low side steering diode.

11. The transient voltage suppressing (TVS) device of claim 1 further comprising:
    a voltage breakdown (VBD) trigger zone formed with a high dopant concentration of first conductivity type in a Zener diode overlapping zone disposed in the epitaxial layer below said buried dopant region to control a voltage breakdown.

12. The transient voltage suppressing (TVS) device of claim 3 further comprising:
    an insulation layer covering a top surface of the semiconductor substrate having openings for forming top contacts with said TVS device.

13. The transient voltage suppressing (TVS) device of claim 1 wherein:
    said first conductivity type is P-type; and said semiconductor substrate functioning as a ground voltage (GND) terminal.

14. The transient voltage suppressing (TVS) device of claim 2 wherein:
    said buried dopant region encompassed in said first epitaxial layer further extending laterally beyond said isolation trenches having an extended bottom junction area to form said Zener diode with an extended PN-junction area.

15. The transient voltage suppressing (TVS) device of claim 1 wherein:
    the epitaxial layer further comprises a bottom and a top epitaxial layer with the buried dopant region disposed at an interface of the bottom epitaxial layer and the top epitaxial layer.

16. The transient voltage suppressing (TVS) device of claim 1 wherein:
    the SCR further comprises a dopant profile to have a configuration of a depleted SCR structure wherein said top dopant layer of the SCR is completely depleted by the first contact region and the epitaxial layer.

17. A transient voltage suppressing (TVS) device comprising:
    a semiconductor substrate of a first conductivity type;

an epitaxial layer of a first conductivity type formed over said semiconductor substrate;

a buried dopant region of a second conductivity type disposed and encompassed in said epitaxial layer of the first conductivity type wherein said buried dopant region having a bottom junction area interfacing with portions of said epitaxial layer underneath thus constituting a Zener diode for said TVS device; and dopant regions above said buried dopant region in combination with the epitaxial layer and said buried dopant region to form a plurality of interfacing PN junctions constituting a depleted SCR acting as a first steering diode to function with said Zener diode; and a second steering diode spaced laterally from the first steering diode for suppressing a transient voltage.

* * * * *